(12) United States Patent  
Tanaka

(10) Patent No.: US 9,110,374 B2  
(45) Date of Patent: Aug. 18, 2015

(54) EXPOSURE AMOUNT EVALUATION METHOD AND PHOTOMASK

(75) Inventor: Satoshi Tanaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 794 days.

(21) Appl. No.: 13/237,736

(22) Filed: Sep. 20, 2011

(65) Prior Publication Data

US 2012/0112085 A1    May 10, 2012

(30) Foreign Application Priority Data

Nov. 10, 2010  (JP) ................................. 2010-252134

(51) Int. Cl.
```
G03F 1/24      (2012.01)
G03F 7/20      (2006.01)
G01J 1/42      (2006.01)
G03F 1/84      (2012.01)
```

(52) U.S. Cl.
CPC . *G03F 1/24* (2013.01); *G01J 1/429* (2013.01); *G03F 1/84* (2013.01); *G03F 7/7085* (2013.01); *G03F 7/70625* (2013.01); *G03F 7/70941* (2013.01)

(58) Field of Classification Search
CPC ............... G01J 1/00; G01J 1/429; G03F 1/24; G03F 1/84  
USPC ........................................................ 250/372  
See application file for complete search history.

(56) References Cited

U.S. PATENT DOCUMENTS

| | | |
|---|---|---|
| 6,317,198 B1 | 11/2001 | Sato et al. |
| 7,034,923 B2 | 4/2006 | Bakker |
| 7,413,831 B2 | 8/2008 | Sugawara |

FOREIGN PATENT DOCUMENTS

| | | |
|---|---|---|
| JP | 4-151818 | 5/1992 |
| JP | 8-304998 | 11/1996 |
| JP | 2005-210127 | 8/2005 |
| JP | 2008-41740 | 2/2008 |
| JP | 2009-278090 | 11/2009 |

OTHER PUBLICATIONS

Notice of Rejection issued by the Japanese Patent Office on Jul. 29, 2014, for Japanese Patent Application No. 2010-252134, and English-language translation thereof.  
Notice of Rejection issued by the Japanese Patent Office on Nov. 26, 2013, for Japanese Patent Application No. 2010-252134, and English-language translation thereof.

*Primary Examiner* — Mark R Gaworecki  
(74) *Attorney, Agent, or Firm* — Finnegan, Henderson, Farabow, Garrett & Dunner, L.L.P.

(57) ABSTRACT

According to the exposure amount evaluation method of the embodiment, a photomask including a long-wavelength light reflective film and a mask pattern is set in an EUV exposure apparatus. The long-wavelength light reflective film reflects long-wavelength light having a wavelength longer than that of EUV light and absorbs the EUV light. The mask pattern is formed by an absorption film which is arranged on the upper side of the long-wavelength light reflective film and absorbs the EUV light and the long-wavelength light. A substrate on which resist is coated are set in the EUV exposure apparatus. Exposure light reflected by the photomask is irradiated to the substrate, and a light amount distribution of the long-wavelength light irradiated to the substrate is measured on the basis of an exposure amount of the exposure light irradiated to the substrate.

8 Claims, 6 Drawing Sheets

EXPOSURE AMOUNT EVALUATION METHOD AND PHOTOMASK

CROSS-REFERENCE TO RELATED APPLICATIONS

This application is based upon and claims the benefit of priority from Japanese Patent Application No. 2010-252134, filed on Nov. 10, 2010; the entire contents of which are incorporated herein by reference.

FIELD

Embodiments described herein relate generally to an exposure amount evaluation method and a photomask.

BACKGROUND

With advancements in miniaturization of semiconductor integrated circuits, for example, manufacturing using an EUV (Extreme Ultra-Violet) exposure apparatus which uses a wavelength shorter than that used in an ArF exposure apparatus has been studied to manufacture micro circuits with a circuit line width of less than 40 nm. An EUV light source with a center wavelength of 13.5 nm has also been developed. For the EUV exposure apparatus, there is no appropriate lens material (high transmittance, high refractive index difference) for forming a dioptric system, and the transmittance in the air is bad, so it is necessary to use reflective optics and a reflective mask in vacuum.

Further, there is no single layer material having a high reflectance with respect to an EUV wavelength. Therefore, reflectance of all reflection mirrors and a mask used in EUV exposure are improved by forming a multilayer film made of at least two types of different materials (for example, Mo, Si, and the like) satisfying Bragg reflection condition on the surfaces thereof.

However, in the EUV exposure, a maximum reflectance of the reflection mirrors is about 70% per reflection mirror. Therefore, considering the number of reflection mirrors required in an EUV optical system (for example, about 15 reflection mirrors), a ratio of an amount of light irradiated onto a wafer to an amount of initial EUV light is $(0.7)^{15}=0.47\%$. Thus, how to increase an output of light source and how to improve light transmission efficiency are important technical objects.

There are a discharge produced plasma type EUV light source and a laser produced plasma type EUV light source. As plasma species, Xe, Sn, or the like are used. Besides the EUV light, light with various wavelengths (so called "outband" components) is generated from plasma. There is little chromatic dispersion in reflective optics, so an amount of light attenuated by reflectance corresponding to each wavelength reaches a mask and a wafer. An EUV resist has photosensitive characteristics for a DUV (Deep Ultra Violet) wavelength (100 nm to 299 nm), so there is concern that DUV light affects pattern transfer characteristics.

As one of methods for highly accurately evaluating how outband components such as DUV light are distributed in an exposure area, there is a method in which a light amount monitor for measuring DUV light is mounted on a wafer stage or a mask stage. However, when using this method, configuration of the apparatus is complicated and it takes time and effort to measure the DUV light. Therefore, it is desired that outband components such as DUV light are easily evaluated.

DETAILED DESCRIPTION

According to an exposure amount evaluation method of the embodiment, a photomask including a long-wavelength light reflective film and a mask pattern is set in an EUV exposure apparatus. The long-wavelength light reflective film reflects long-wavelength light having a wavelength longer than that of EUV light in exposure light and absorbs the EUV light. The mask pattern is formed by using an absorption film which is arranged on the upper side of the long-wavelength light reflective film and absorbs the EUV light and the long-wavelength light. Also, a substrate to be exposed on which resist is coated is set in the EUV exposure apparatus. Then, the exposure light is irradiated to the photomask from the side of the mask pattern and the exposure light reflected by the photomask is irradiated to the substrate. Thereafter, a light amount distribution of the long-wavelength light irradiated to the substrate is measured on the basis of an exposure amount of the exposure light irradiated to the substrate.

An exemplary embodiment of an exposure amount evaluation method and a photomask will be explained below in detail with reference to the accompanying drawings. The present invention is not limited to the following embodiment.

Embodiment

Figure 1:
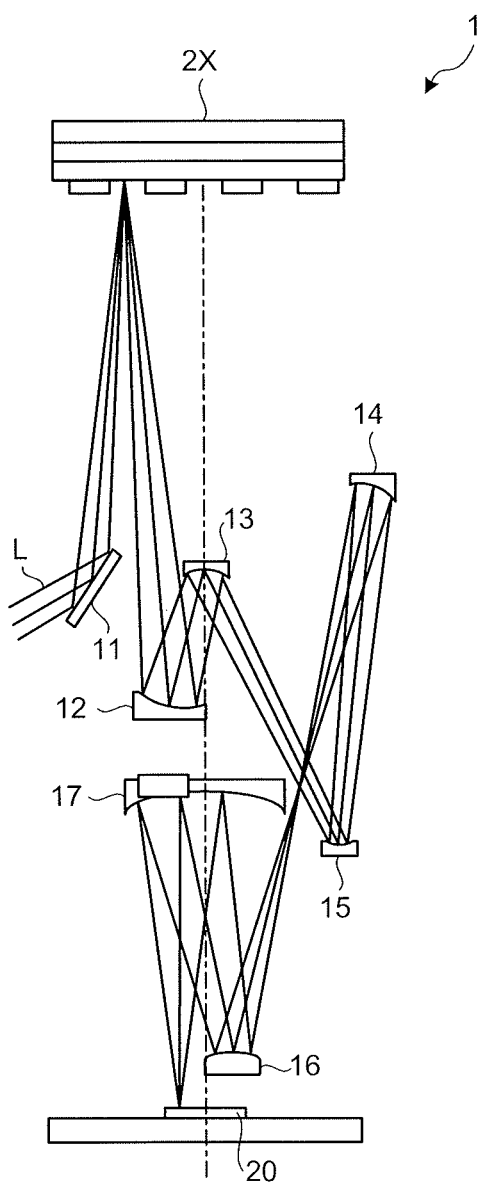
FIG. 1 is a diagram showing a configuration of an EUV exposure apparatus.

FIG. 1 is a diagram showing a configuration of an EUV exposure apparatus. The EUV exposure apparatus 1 is an apparatus for emitting EUV light to a substrate such as a wafer 20 and performing EUV exposure. When the EUV exposure apparatus 1 exposes a product wafer (not shown in the drawings), the EUV exposure apparatus 1 exposes the product wafer by using a mask (not shown in the drawings) in which a circuit pattern (mask pattern) is formed. When evaluating outband components (DUV light and the like) such as DUV light having a long wavelength other than the wavelength of the EUV light, the EUV exposure apparatus 1 exposes the wafer 20 by using a mask (photomask) 2X for evaluating an amount of exposure.

In the present embodiment, the EUV exposure apparatus 1 exposes the wafer 20 by using the mask 2X. An amount of DUV light irradiated to the wafer 20 by the EUV exposure apparatus 1 is evaluated on the basis of light intensity obtained on the wafer 20.

The EUV exposure apparatus 1 transmits exposure light L transmitted from a light source (not shown in the drawings) to the mask 2X via a reflection mirror 11. A part of the exposure light L is reflected by the mask 2X, and the reflected exposure light L is irradiated to the wafer 20 via reflection mirrors 12 to 17.

The light source is, for example, a discharge plasma type light source or a laser plasma type light source. As a plasma species, Xe, Sn, or the like is used. The exposure light L transmitted from the light source to the wafer 20 includes EUV light as well as DUV light and the like having a wavelength different from that of the EUV light.

Figure 2:
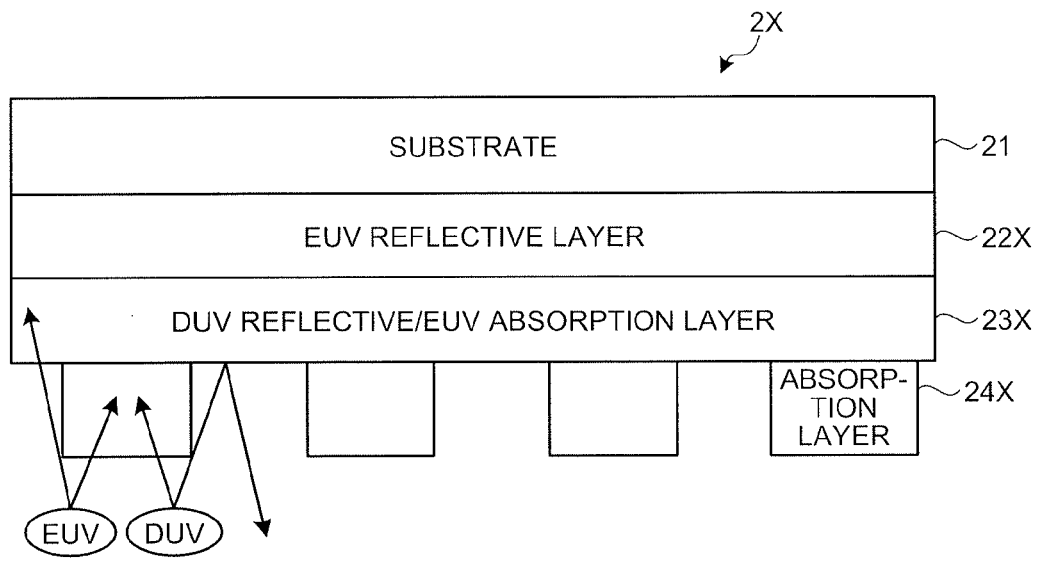
FIG. 2 is a diagram showing a configuration example of a mask according to a first embodiment.

FIG. 2 is a diagram showing a configuration example of the mask according to the first embodiment. FIG. 2 shows a cross-sectional configuration of the mask 2X. In the mask 2X, an EUV reflective layer 22X having a high reflectance with respect to the EUV light (center wavelength of EUV area is 13.5 nm) is stacked on a substrate (a mask substrate such as a glass substrate) 21 having a low thermal expansion coefficient and high flatness. Further, a DUV reflective/EUV absorption layer 23X that reflects DUV light and absorbs EUV light is stacked on the upper side of the EUV reflective layer 22X. An absorption layer 24X (a low reflective material with respect to DUV light area) that absorbs EUV light and DUV light is stacked on the upper side of the DUV reflective/EUV absorption layer 23X.

A mask pattern of exposure amount monitor pattern is formed on the mask 2X by using the absorption layer 24X. When forming the exposure amount monitor pattern, a resist pattern is formed on the absorption layer 24X by an electron beam lithography apparatus or the like and the absorption layer 24X is etched from above the resist pattern.

When the exposure light L is irradiated onto the wafer 20 by using the EUV exposure apparatus 1, EUV light and DUV light are irradiated onto the wafer 20. When measuring the DUV light, the mask 2X is set in the EUV exposure apparatus 1.

When the EUV light is irradiated to the mask 2X from the side of the absorption layer 24X, the EUV light is absorbed by the absorption layer 24X and the DUV reflective/EUV absorption layer 23X. On the other hand, the DUV light is absorbed by the absorption layer 24X and reflected by the DUV reflective/EUV absorption layer 23X. Therefore, a pattern corresponding to the mask pattern formed by using the absorption layer 24X is transferred onto the wafer 20.

Next, a specific example of the mask 2X will be described. In the mask 2X, for example, the DUV reflective/EUV absorption layer 23X is formed of Ta (tantalum) and the absorption layer 24X is formed of Cr (chromium).

Figure 3:
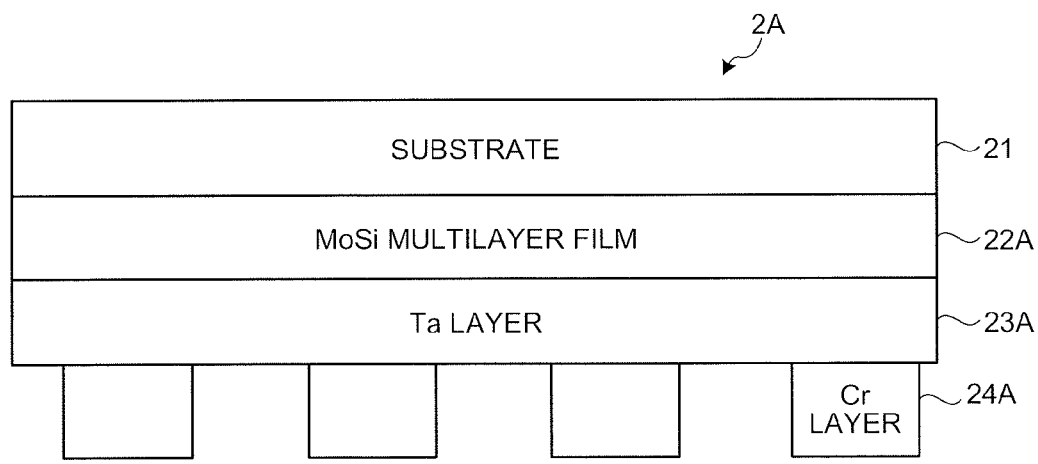
FIG. 3 is a diagram showing a configuration of a mask in which an EUV absorption layer is formed of Ta and a DUV absorption layer is formed of Cr.

FIG. 3 is a diagram showing a configuration of a mask in which an EUV absorption layer is formed of Ta and a DUV absorption layer is formed of Cr. FIG. 3 shows a cross-sectional configuration of a mask 2A, which is an example of the mask 2X. In the mask 2A, an MoSi (molybdenum silicide) multilayer film 22A, which is an example of the EUV reflective layer 22X, is stacked on the substrate 21. Further, a Ta layer 23A, which is an example of the DUV reflective/EUV absorption layer 23X, is stacked on the upper side of the MoSi multilayer film 22A. Furthermore, a Cr layer 24A, which is an example of the absorption layer 24X, is stacked on the upper side of the Ta layer 23A. The exposure amount monitor pattern is formed on the mask 2A by using the Cr layer 24A.

Figure 4:
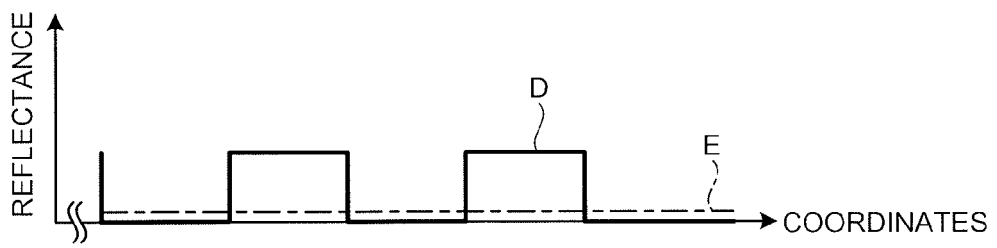
FIG. 4 is a diagram showing reflectance characteristics of DUV light on a DUV reflective/EUV absorption layer.

FIG. 4 is a diagram showing reflectance characteristics of the DUV light on the DUV reflective/EUV absorption layer. The horizontal axis of the graph shown in FIG. 4 indicates coordinates on the mask 2A (mask 2X) and the vertical axis indicates reflectance of the mask 2A (mask 2X). The EUV light is absorbed by the Ta layer 23A (DUV reflective/EUV absorption layer 23X) and the Cr layer 24A (absorption layer 24X). Therefore, reflectance characteristics E of the EUV light is substantially 0 on the entire surface of the mask 2A.

On the other hand, the DUV light is reflected by the Ta layer 23A and absorbed by the Cr layer 24A. Therefore, reflectance characteristics D of the DUV light indicate a predetermined value at a position corresponding to the Ta layer 23A and indicate substantially 0 at a position corresponding to the Cr layer 24A.

Thereby, even when the EUV light is irradiated onto the mask 2A, the EUV light is not irradiated onto the wafer 20. On the other hand, the DUV light reflected at a position corresponding to the Ta layer 23A is irradiated onto the wafer 20. Therefore, it is possible to form a reflectance pattern distribution corresponding to the presence or absence of the Cr layer 24A, on the wafer 20.

Figure 5A:
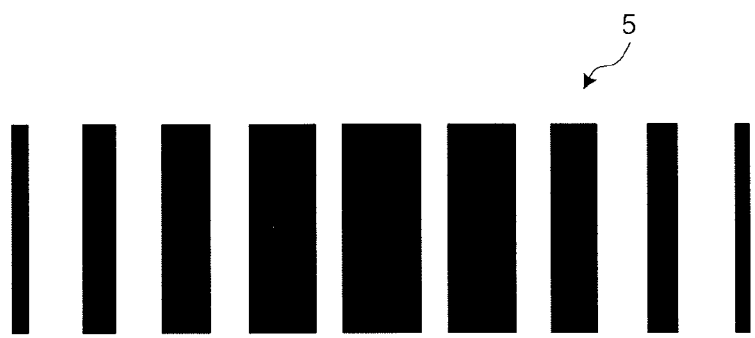
FIGS. 5A and 5B are diagrams for explaining an exposure amount monitor pattern.
Figure 5B:
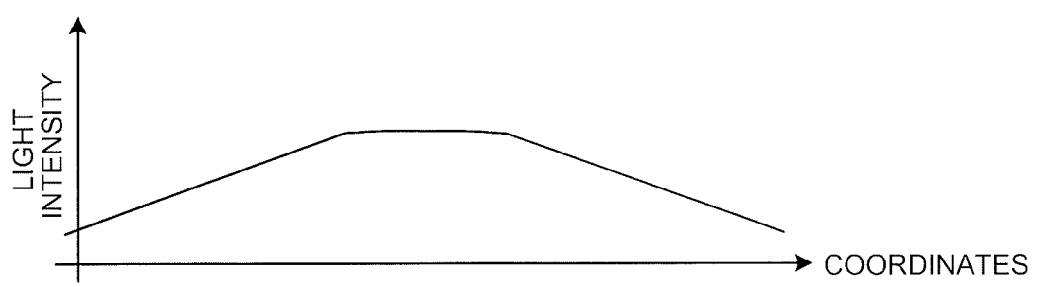

FIGS. 5A and 5B are diagrams for explaining the exposure amount monitor pattern. The exposure amount monitor pattern 5 is a mask pattern for measuring light intensity (exposure amount) of the DUV light irradiated onto the wafer 20. As shown in FIG. 5A, the exposure amount monitor pattern 5 is formed by a line-and-space pattern. The line-and-space pattern is a pattern in which a line pattern and a space pattern (space area) are alternately arranged at a predetermined pitch. The line-and-space pattern of the exposure amount monitor pattern 5 is formed so that the pattern pitch is the same and a duty ratio of the line pattern and the space pattern gradually changes.

Specifically, at the left end portion and the right end portion of the exposure amount monitor pattern 5, a line-and-space pattern in which the width of the space pattern is larger than that of the line pattern (the duty ratio is large) is arranged. The nearer to the center of the exposure amount monitor pattern 5, the smaller the duty ratio of the arranged line-and-space pattern is. Thereby, a line-and-space pattern having a largest duty ratio is arranged at the left end portion and the right end portion of the exposure amount monitor pattern 5, and a line-and-space pattern having a smallest duty ratio is arranged at the center of the exposure amount monitor pattern 5.

When it is assumed that a center wavelength of a wavelength area (DUV area), which is a wavelength area longer than that of the EUV light and is an object to be detected, is λ, a projection optics numerical aperture of the EUV exposure apparatus 1 is NA, and the size of an effective light source is σ, and it is assumed that the pitch at which the line pattern and the space pattern of the exposure amount monitor pattern 5 are arranged is P, a value indicated by the following formula (1) is set to P.

$$P < \lambda / \{(1+\sigma)NA\} \quad (1)$$

When the EUV light and the DUV light are irradiated onto the exposure amount monitor pattern 5, a part of the DUV light is reflected by the exposure amount monitor pattern 5 and irradiated onto the wafer 20. The DUV light irradiated onto the wafer 20 has light intensity according to the pattern shape of the exposure amount monitor pattern 5.

The horizontal axis of the graph shown in FIG. 5B indicates coordinates on the exposure amount monitor pattern 5 and the vertical axis indicates light intensity on the wafer 20. As shown in FIG. 5B, the light intensity is small at a position where the duty ratio is large in the exposure amount monitor pattern 5, and the light intensity is large at a position where the duty ratio is small.

Specifically, the light intensity is minimum at positions on the wafer 20 corresponding to the left end portion and the right end portion of the exposure amount monitor pattern 5 (positions where the duty ratio is maximum). The nearer to a position on the wafer 20 corresponding to the center of the exposure amount monitor pattern 5, the larger the light intensity is. Thereby, the light intensity is maximum at the position on the wafer 20 corresponding to the center of the exposure amount monitor pattern 5 (position where the duty ratio is minimum). Under the setting condition described above, it is known that the light intensity distribution, at least in the DUV light area, is very low sensitive with respect to focus variation when exposure is performed. Therefore, it is possible to evaluate DUV exposure amount distribution in the exposure area with a high degree of accuracy by the exposure amount monitor pattern separately from other process variation factors.

A plurality of exposure amount monitor patterns 5 may be prepared and peripheral patterns having various coverage rates may be arranged on the exposure amount monitor patterns 5. Thereby, it is possible to evaluate light intensity of the DUV light according to the coverage rates.

When evaluating the DUV light irradiated onto the wafer 20 by the EUV exposure apparatus 1, an EUV resist is coated on the wafer 20 in advance. Then, the exposure light L is irradiated onto the wafer 20 by using the mask 2A, and thereafter, the wafer 20 is developed. Thereby, a DUV transfer image (transfer pattern) that is insensitive to focus position is formed on the wafer 20. Thereafter, the exposure amount of the DUV light on the wafer 20 is obtained on the basis of the pattern shape of the DUV transfer image.

For example, a correlation between the exposure amount of the DUV light and the pattern shape of the DUV transfer image formed on the wafer is obtained in advance. Then, the exposure amount of the DUV light is obtained on the basis of the correlation and the pattern shape of the DUV transfer image formed on the wafer 20. Thereby, it is possible to quantitatively evaluate the exposure amount distribution in the DUV light area.

The reflectance of the DUV light and the reflectance of the EUV light of the mask for evaluating the exposure amount (masks 2X, 2A, and a mask 2B described below) may be different from those of a product mask used to expose a product wafer. In such a case, by considering the difference of reflectance (reflectance of the DUV light and the EUV light) between the mask for evaluating the exposure amount and the product mask, the exposure amount of the DUV light irradiated onto the product wafer may be obtained. In other words, by correcting the exposure amount of the DUV light on the wafer 20 on the basis of the difference of reflectance between the mask for evaluating the exposure amount and the product mask, the exposure amount of the DUV light irradiated onto the product wafer may be obtained.

After obtaining the exposure amount of the DUV light irradiated onto the wafer 20, the exposure amount variation of the DUV light may be inspected by comparing the shape of the pattern formed on the wafer 20 when the exposure amount is measured and the shape of the pattern formed on the wafer 20 when a periodic inspection or the like is performed afterwards.

Although, in the present embodiment, the exposure amount of the DUV light is obtained after forming a pattern on the wafer 20, the exposure amount of the DUV light may be obtained without forming a pattern on the wafer 20. In this case, the exposure amount of the DUV light irradiated onto the wafer 20 may be detected by using, for example, a CCD (Charge Coupled Device) sensor or other light receiving element.

Figure 6:
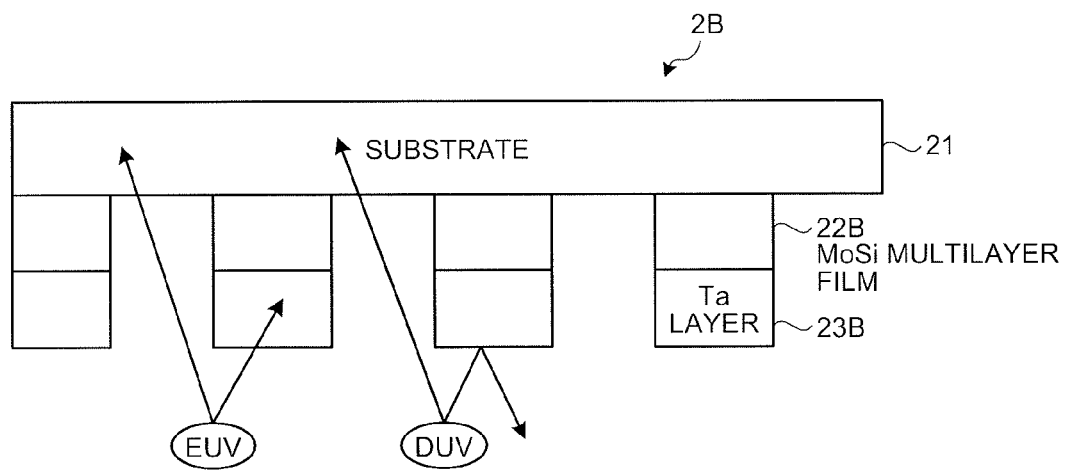
FIG. 6 is a diagram showing a configuration of a mask when DUV light is absorbed by a substrate.

Although, in the present embodiment, the DUV light is absorbed by the Cr layer 24A in the mask 2A, the DUV light may be absorbed by a layer other than the Cr layer 24A (for example, substrate 21). FIG. 6 is a diagram showing a configuration of a mask when the DUV light is absorbed by a substrate. FIG. 6 shows a cross-sectional configuration of the mask 2B.

In the mask 2B, an MoSi multilayer film 22B, which is an example of the EUV reflective layer 22X, is stacked on the substrate 21. The substrate 21 is formed of a material that is low reflective to the DUV light and the EUV light (for example, formed of a transparent material). A Ta layer 23B, which is an example of the DUV reflective/EUV absorption layer 23X, is stacked on the upper side of the MoSi multilayer film 22B. In the mask 2B, the exposure amount monitor pattern 5 is formed by using the MoSi multilayer film 22B and the Ta layer 23B. In the mask 2B, the exposure amount monitor pattern 5 is formed by performing patterning of the same shape on the MoSi multilayer film 22B and the Ta layer 23B.

When forming the exposure amount monitor pattern, a resist pattern is formed on the Ta layer 23B by an electron beam lithography apparatus or the like and the Ta layer 23B and the MoSi multilayer film 22B are etched from above the resist pattern.

In this way, the MoSi multilayer film 22B and the Ta layer 23B are shaved into the shape of the exposure amount monitor pattern, and thereby the reflectance of the EUV light of the layer where the MoSi multilayer film 22B is shaved off (substrate 21) can be substantially 0.

When the EUV light is irradiated to the mask 2B from the side of the Ta layer 23B, the EUV light is absorbed by the Ta layer 23B and the EUV light passes through the substrate 21. On the other hand, the DUV light is reflected by the Ta layer 23B and the DUV light passes through the substrate 21. Therefore, a pattern corresponding to the mask pattern formed in the Ta layer 23B and the MoSi multilayer film 22B is transferred onto the wafer 20.

Figure 7:
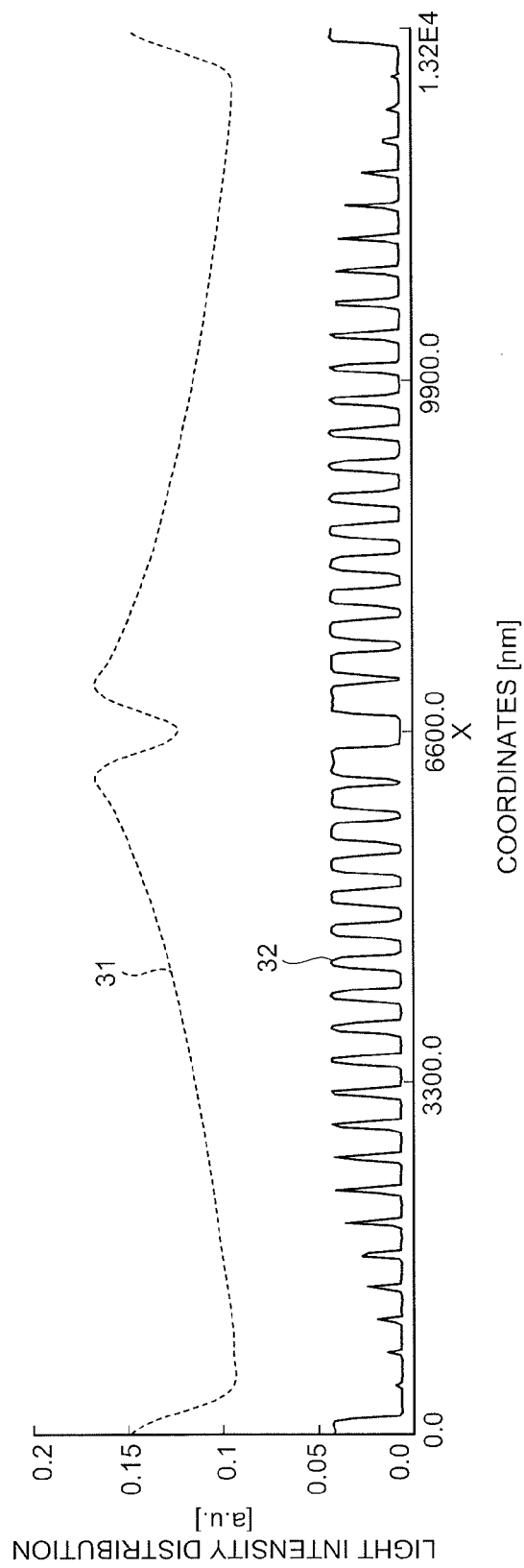
FIG. 7 is a diagram showing a simulation result of light intensity distribution obtained by the mask shown in FIG. 6.

FIG. 7 shows a simulation result of a transfer image. FIG. 7 is a diagram showing a simulation result of light intensity distribution obtained by the mask shown in FIG. 6. In the graph shown in FIG. 7, the horizontal axis indicates coordinates and the vertical axis indicates the light intensity distribution. The characteristics 32 is a simulation result of light intensity distribution of the EUV light (center wavelength is 13.5 nm), and the characteristics 31 is a simulation result of light intensity distribution of the DUV light (center wavelength is 199 nm). As a simulation condition, NA=0.25 and σ=0.8 are selected. In this condition, there is concern that the amount of reflected EUV light is relatively large even in an area corresponding to the EUV absorption layer and DUV light measuring accuracy is degraded.

Figure 8:
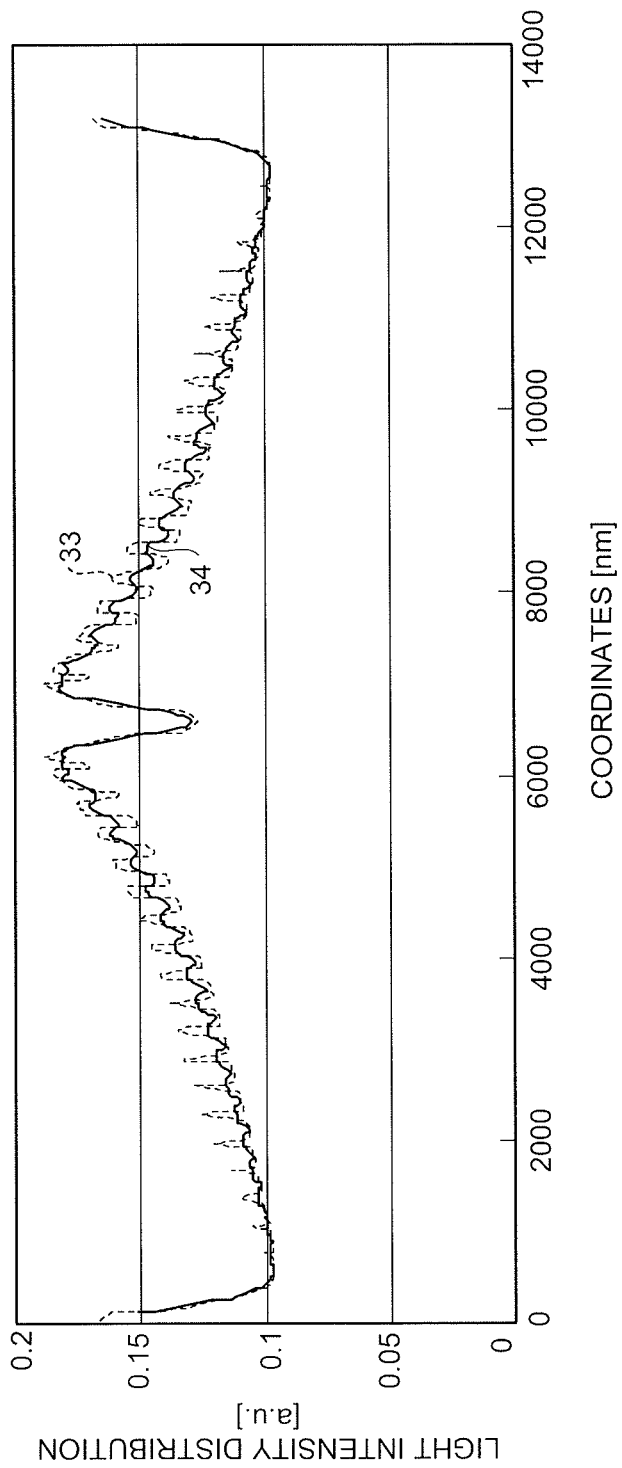
FIG. 8 is a diagram showing an intensity sum calculation result of the light intensity distribution shown in FIG. 7.

FIG. 8 shows a synthesized image of the EUV light+the DUV light, and a synthesized image at a position defocused by about 300 nm. FIG. 8 is a diagram showing an Intensity sum calculation result of the light intensity distribution shown in FIG. 7. In the graph shown in FIG. 8, the horizontal axis indicates coordinates and the vertical axis indicates the light intensity distribution. The characteristics 33 is an intensity sum of EUV light intensity and DUV light intensity (synthesized image of the EUV light and the DUV light), and the characteristics 34 is a synthesized image of the EUV light and the DUV light (defocus). It is understood that image intensity of the EUV light varies and the variation affects the synthesized image. To improve accuracy, a film for reducing the amount of reflected EUV light may be additionally formed on the EUV absorption layer 23B or the film thickness of the EUV absorption layer 23B may be formed thicker than before so as to reduce the reflectance of the EUV light on the EUV absorption layer 23B.

In the mask 2X, a buffer layer may be provided between the EUV reflective layer 22X and the DUV reflective/EUV absorption layer 23X. Although, in the present embodiment, the mask 2X has the EUV reflective layer 22X, the mask 2X need not have the EUV reflective layer 22X. Although the mask 2B has the MoSi multilayer film 22B, the mask 2B need not have the MoSi multilayer film 22B.

The absorption layer 24X is not limited to the Cr layer 24A, but the absorption layer 24X may include a low reflective material with respect to the DUV light, such as a C film, a Cr/CrO film, a CrN film, an SiO film, an SiN film, and a Cr/F film.

Although, in the present embodiment, the exposure amount monitor pattern 5 is formed by the absorption layer 24X (low reflective material) which absorbs the DUV light, the exposure amount monitor pattern 5 may be formed by a reflective layer that reflects the DUV light at high reflectance, such as an Ru film, an Si film, and an Al film.

In other words, the exposure amount monitor pattern 5 may be formed by using two types of films having different reflectance of the DUV light. For example, in the mask 2X, a film having first DUV light reflectance is stacked at the position of the DUV reflective/EUV absorption layer 23X and the exposure amount monitor pattern 5 having second DUV light reflectance is formed on the upper side of the film (at the position of the absorption layer 24X).

In the mask 2B, the substrate 21 is formed by a material having third DUV light reflectance and the exposure amount monitor pattern 5 having fourth DUV light reflectance is formed on the upper side of the material (at the position of Ta 23B).

Here, a difference between the first DUV light reflectance and the second DUV light reflectance is, for example, 15% or more. A difference between the third DUV light reflectance and the fourth DUV light reflectance is, for example, 15% or more.

For example, the DUV light reflectance of the Ta film is 19%, and the DUV light reflectance of a glass substrate is 4%. The DUV light reflectance of the CrN film is 18%, the DUV light reflectance of the Ru film is 67%, and the DUV light reflectance of the Si film is 54%. The exposure amount monitor pattern 5 is formed by using a combination of film layers having such various DUV light reflectance values.

The smaller a difference between the EUV light reflectance of the film having the first DUV light reflectance and the EUV light reflectance of the exposure amount monitor pattern 5, the better. The smaller a difference between the EUV light reflectance of the substrate 21 and the EUV light reflectance of the exposure amount monitor pattern 5, the better.

The DUV reflective/EUV absorption layer 23X is not limited to a layer that absorbs the EUV light, but may be a layer through which the EUV light passes. The substrate 21 is not limited to a material through which the DUV light and the EUV light pass, but may be formed of a material that absorbs the DUV light and the EUV light.

It is possible to perform pattern transfer prediction including influence of exposure of outband components on the basis of the exposure amount distribution after obtaining the exposure amount distribution of the DUV light area. When performing the pattern transfer prediction, it is possible to perform highly accurate pattern transfer prediction by performing an EUV flare calculation and the like on the basis of the exposure amount distribution of the DUV light area. Also, it is possible to correct a mask pattern (design pattern) on the basis of the prediction result of the pattern transfer prediction.

The mask pattern is corrected as necessary, and thereafter, a semiconductor device (semiconductor integrated circuit) is manufactured by using a product mask. In the product mask, a reflective layer of the EUV light is formed on the substrate, and an absorption layer of the EUV light is formed on the reflective layer of the EUV light. Then, a circuit pattern is formed in the absorption layer of the EUV light.

When manufacturing a semiconductor device, the product mask is set in the EUV exposure apparatus 1. Then, exposure of a product wafer is performed by using the product mask on a wafer on which resist is coated. When the EUV light is irradiated to the product mask from the side of the absorption layer of the EUV light, the EUV light is absorbed by the absorption layer of the EUV light, and the EUV light is reflected by the reflective layer of the EUV light. Therefore, a pattern corresponding to the circuit pattern formed by using the absorption layer of the EUV light is transferred onto the product wafer.

Thereafter, the product wafer is developed and a resist pattern is formed on the product wafer. Then, the layer under the resist pattern is etched by using the resist pattern as a mask. Thereby, an actual pattern corresponding to the resist pattern is formed on the product wafer. When manufacturing a semiconductor device, the correction process, the exposure process, the development process, the etching process of the mask pattern and the like described above are preformed for each layer.

As described above, according to the embodiment, the exposure amount monitor pattern is formed by using at least two types of films having a difference of reflectance of the DUV light, so that it is possible to easily evaluate the exposure light having wavelength other than that of the EUV light. Therefore, it is possible to accurately predict the pattern transfer characteristics on the product wafer when the EUV exposure is performed by using the EUV exposure apparatus 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure amount evaluation method comprising:

setting a photomask and a substrate to be exposed in an EUV exposure apparatus, wherein:

the photomask includes:

an absorption film absorbing EUV light in exposure light and long-wavelength light having a wavelength longer than that of the EUV light; and a mask pattern formed by a long-wavelength light reflective film arranged on an upper side of the absorption film, the mask pattern absorbing the EUV light and reflecting the long-wavelength light; and resist is coated on the substrate;

irradiating the exposure light to the photomask from a side of the mask pattern and irradiating the exposure light reflected by the photomask to the substrate; and measuring a light amount distribution of the long-wavelength light irradiated to the substrate based on an exposure amount of the exposure light irradiated to the substrate.

2. The exposure amount evaluation method according to claim 1, further comprising:

forming a transfer pattern corresponding to the mask pattern on the substrate by developing the substrate irradiated by the exposure light reflected by the photomask; and measuring the light amount distribution of the long-wavelength light irradiated to the substrate on the basis of a pattern shape of the transfer pattern when measuring the light amount distribution.

3. The exposure amount evaluation method according to claim 2, wherein, when it is assumed that a center wavelength of a wavelength area of the long-wavelength light is $\lambda$, a projection optics numerical aperture of the EUV exposure apparatus is NA, a size of a coherence factor of the exposure light is $\sigma$, and a pitch is P, the pitch has a relationship of $P<\lambda/\{(1+\sigma)NA\}$.

4. The exposure amount evaluation method according to claim 1, wherein the mask pattern has a pattern shape in which a line pattern and a space area are alternately arranged at a predetermined pitch.

5. The exposure amount evaluation method according to claim 1, wherein the absorption film includes Cr, C, Cr/CrO, SiO, SiN, or Cr/F.

6. The exposure amount evaluation method according to claim 1, wherein there are a plurality of mask patterns and a peripheral pattern having a coverage rate different from each other is arranged in each mask pattern.

7. The exposure amount evaluation method according to claim 1, wherein the long-wavelength light having a wavelength longer than that of the EUV light is DUV light.

8. The exposure amount evaluation method according to claim 1, wherein an EUV reflective film that reflects the EUV light is formed between a lower side of the long-wavelength light reflective film and a upper side of the absorption film.

* * * * *